United States Patent
Brand

(12) 
(10) Patent No.: US 6,528,890 B1
(45) Date of Patent: Mar. 4, 2003

(54) CIRCUIT, METHOD OF ADHERING AN INTEGRATED CIRCUIT DEVICE TO A SUBSTRATE, AND METHOD OF FORMING A CIRCUIT

(75) Inventor: Joseph M. Brand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 09/616,095

(22) Filed: Jul. 14, 2000

Related U.S. Application Data

(62) Division of application No. 09/203,881, filed on Dec. 1, 1998.

(51) Int. Cl.[7] .............................................. H01L 23/48
(52) U.S. Cl. ..................... 257/778; 257/779; 257/780; 257/783; 438/118; 438/119
(58) Field of Search ................. 257/783, 778, 257/737, 779, 780, 789, 738; 438/106, 108, 118, 119, 612, 613

(56) References Cited

U.S. PATENT DOCUMENTS

| | | | |
|---|---|---|---|
| 4,732,446 A | 3/1988 | Gipson et al. | 350/96.15 |
| 4,835,859 A | 6/1989 | Beckett | 29/846 |
| 4,984,358 A | 1/1991 | Nelson | 29/830 |
| 5,019,943 A | 5/1991 | Fassbender et al. | 361/396 |
| 5,496,775 A | 3/1996 | Brooks | |
| 5,578,696 A | 11/1996 | Mochizuki et al. | |
| 5,726,391 A | 3/1998 | Iyer et al. | 174/52.2 |
| 5,834,339 A | 11/1998 | Distefano et al. | 438/125 |
| 5,872,400 A * | 2/1999 | Chapman et al. | 257/738 |
| 5,897,336 A | 4/1999 | Broullitte et al. | 438/108 |
| 5,930,597 A | 7/1999 | Call et al. | 438/106 |
| 5,930,599 A | 7/1999 | Fujimoto et al. | 438/113 |
| 5,952,725 A | 9/1999 | Ball | 438/458 |
| 5,956,605 A * | 9/1999 | Akram et al. | 438/613 |
| 6,002,172 A * | 12/1999 | Desai et al. | 257/737 |
| 6,011,694 A | 1/2000 | Hirakawa | 361/774 |
| 6,061,248 A * | 5/2000 | Otani et al. | 361/777 |
| 6,077,725 A | 6/2000 | Degani et al. | 438/108 |
| 6,103,551 A | 8/2000 | Ono et al. | 438/108 |
| 6,222,738 B1 * | 4/2001 | Maeno et al. | 361/772 |

OTHER PUBLICATIONS

"4–1. Nitto R&D Road Map for Flip Chip Package Materials"; Nitto Denko America, Inc.; Mar. 15, 2000; pps. 1–4.

* cited by examiner

Primary Examiner—Steven Loke
Assistant Examiner—Donghee Kang
(74) Attorney, Agent, or Firm—Wells St. John, P.S.

(57) ABSTRACT

The present invention includes circuits, methods of adhering an integrated circuit device to a substrate, and methods of forming a circuit. According to one aspect of the present invention, a method of forming a circuit includes: providing an integrated circuit device having an outer surface and a plurality of conductive bumps upon the outer surface; providing a substrate having a plurality of bond pads which correspond to respective ones of the conductive bumps; providing an electrically insulative adhesive over at least a portion of the outer surface of the integrated circuit device; and coupling the integrated circuit device and the substrate following the providing the adhesive, the coupling connecting the outer surface of the integrated circuit device with the substrate and forming a plurality of electrical interconnections comprising the conductive bumps and the bond pads.

11 Claims, 4 Drawing Sheets

CIRCUIT, METHOD OF ADHERING AN INTEGRATED CIRCUIT DEVICE TO A SUBSTRATE, AND METHOD OF FORMING A CIRCUIT

RELATED PATENT DATA

This patent resulted from a divisional application of U.S. patent application Ser. No. 09/203,881, filed Dec. 1, 1998, entitled "Circuit, Method of Adhering an Integrated Circuit Device to a Substrate, and Method of Forming a Circuit", naming Joseph M. Brand as inventor, the disclosure of which is incorporated by reference.

TECHNICAL FIELD

The present invention relates to circuits, methods of adhering an integrated circuit device to a substrate, and methods of forming a circuit.

BACKGROUND OF THE INVENTION

Flip chip packages have become increasingly popular for housing integrated circuits and providing electrical connection of integrated circuits with an external substrate. The desire to provide chip assemblies having increased density and durability has broadened the use of flip chips in electronics manufacturing. Conventional flip chip configurations typically include a semiconductor die having a plurality of conductive bumps, such as solder, provided upon bond pads of the chip. The chip is "flipped" over and bonded with the bumps to bond pads of another substrate, thus the term "flip chip."

In some instances following conductive bonding of the flip chip relative to the substrate, a needle is utilized to deposit an electrically insulative underfill adhesive material adjacent edges of the flip chip. The underfill adhesive material facilitates bonding of the flip chip to the substrate.

In such conventional attachment methods, the dispensing needle is positioned approximately 3 to 5 mils away from the flip chip and 1 to 3 mils off or above the substrate. The underfill material is dispensed onto adjacent sides of the flip chip and allowed to flow or wick under the flip chip. In other words, the deposited underfill material is intended to be received by the sides of the flip chip and flows towards the center of the flip chip.

It is desired that the underfill material substantially fill the volume intermediate the flip chip and the substrate to facilitate a better mechanical connection of the flip chip with the substrate. In particular, the underfill material supplements the electrical interconnections formed by the conductive bumps and the bond pads which also tend to function as mechanical couplings. In preferred configurations, the underfill material tends to alleviate stress imposed upon the electrical connections. Further, the underfill material forms a hermetic seal and provides a flexible buffer material to absorb stress resulting from subsequent high temperature fabrication steps.

The conventional methods of connecting flip chips with external substrates have various drawbacks. For example, a considerable length of time is typically necessary for the underfill material to flow from the deposition sites along adjacent sides of a particular flip chip to areas beneath the flip chip. In addition, a plurality of voids commonly remain intermediate the flip chip and corresponding substrate. Formation of an underfill material layer having plural voids can in some instances provide less than desired sealing. Further, the flip chip and substrate are both exposed to elevated temperatures, such as 80–120 degrees Centigrade, during the underfill wicking process to urge flowing of the underfill materials.

Therefore, a need exists to provide improved connections of flip chips and substrates and improved methodologies of connecting flip chips with substrates.

SUMMARY OF THE INVENTION

The present invention includes circuits, methods of adhering an integrated circuit device to a substrate, and methods of forming a circuit.

A first aspect of the present invention provides an integrated circuit bonding method including the steps of providing an integrated circuit device having a plurality of conductive bumps, and providing an electrically insulative adhesive upon at least a portion, of an outer surface of the integrated circuit device. The method also includes bringing a substrate and the integrated circuit device into proximity with one another. The integrated circuit device bonding method also includes bonding the outer surface of the integrated circuit device to a substrate using the adhesive with at least some of the conductive bumps being in electrical communication with circuitry of the substrate.

Another aspect of the present invention provides a method of forming a circuit. The method includes the steps of providing an integrated circuit device having an outer surface and a plurality of conductive bumps upon the outer surface, and providing a substrate having a plurality of bond pads which correspond to respective ones of the conductive bumps. The method further includes the steps of providing an electrically insulative adhesive over at least a portion of the outer surface of the integrated circuit device and coupling the integrated circuit device and the substrate following the providing of the adhesive. The coupling connects the outer surface of the integrated circuit device with the substrate and forms a plurality of electrical interconnections comprising the conductive bumps and the bond pads.

According to another aspect of the present invention, a circuit comprises an integrated circuit device having an outer surface and a plurality of conductive bumps upon the outer surface. The circuit additionally includes a substrate having an outer surface and a plurality of bond pads upon the outer surface. The bond pads are electrically coupled with the conductive bumps of the integrated circuit device in opposing relation. The outer surface of the integrated circuit device and the outer surface of the substrate define a buffer volume therebetween. The circuit further includes an adhesive which bonds the outer surface of the integrated circuit device and the outer surface of the substrate. The buffer volume has a greater volume of void space than adhesive. Certain aspects of the present invention provide a plurality of discrete adhesive fillets formed about the coupled conductive bumps and corresponding bond pads of the integrated circuit device and the substrate.

The present invention also provides additional structure and methodology aspects.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
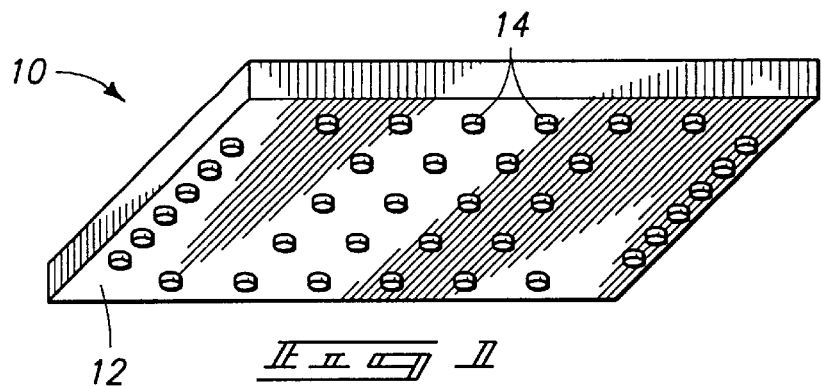
FIG. 1 is an isometric view of an exemplary flip chip having an outer surface and a plurality of conductive bumps thereon.
Figure 2:
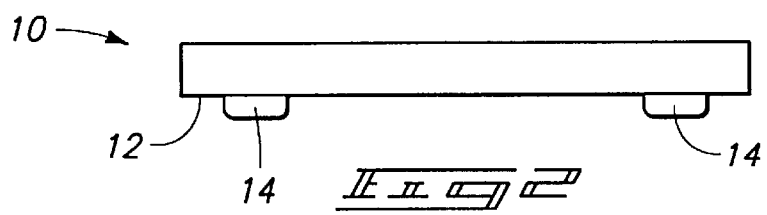
FIG. 2 is a side view of a flip chip and plural conductive bumps thereof.

Referring to FIG. 1, an exemplary integrated circuit device comprising a flip chip 10 is illustrated. Although the disclosure is described herein with reference to flip chip technology, the present invention also encompasses other uses and is applicable to other integrated circuitry packaging technologies. Flip chip 10 includes an outer surface 12 having a plurality of conductive bumps 14 formed thereon. Conductive bumps 14 are electrically coupled with appropriate bond pads of the semiconductor die. In the described embodiment, conductive bumps 14 individually comprise a flowable conductive material such as solder. Other materials for conductive bumps 14 can be utilized.

Referring to FIG. 2–FIG. 6, exemplary methods of coupling flip chip 10 with an external substrate (shown in FIG. 4–FIG. 6) are described. The flip chips depicted in FIG. 2–FIG. 14 differ from the flip chip depicted in FIG. 1 in terms of scale and orientation of conductive bumps 14 for simplicity of illustration. Bumps 14 of flip chip 10 are pointing in a downward direction in the disclosed embodiments. Flip chip 10 may be oriented in any other suitable direction during various processing steps described herein.

Figure 3:
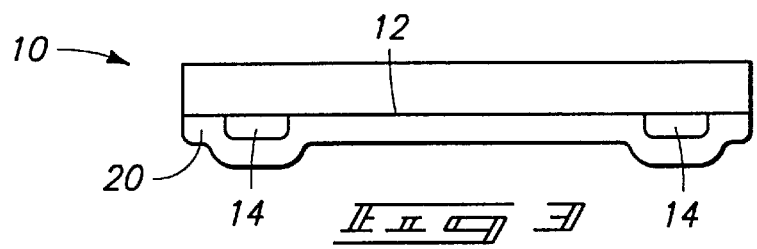
FIG. 3 is a side view of a flip chip having an adhesive provided over an outer surface and plural conductive bumps.

Referring to FIG. 3, an electrically insulative adhesive is formed as a layer 20 upon at least a portion of outer surface 12 of flip chip 10. Adhesive layer 20 is shown provided over outer surface 12 and conductive bumps 14 of flip chip 10. As illustrated, adhesive layer 20 is formed over substantially the entire outer surface 12 of flip chip 10. The adhesive utilized to form layer 20 preferably comprises an etchable adhesive. An exemplary adhesive material utilized to form layer 20 is polyimide. Other materials are utilized to form layer 20 in other embodiments. The adhesive utilized to form layer 20 is configured to facilitate bonding outer surface 12 of flip chip 10 with a substrate. Adhesive layer 20 is preferably formed to a thickness approximately equal to or greater than the height of conductive bumps 14. Alternatively, adhesive layers of other thicknesses are formed prior to coupling of flip chip 10 with a substrate.

Figure 4:
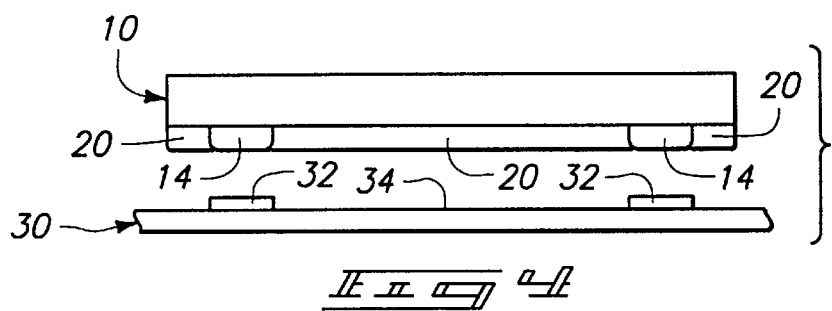
FIG. 4 is a side view of a flip chip having adhesive and being aligned with a substrate having plural bond pads.

Referring to FIG. 4, an attachment process of flip chip 10 is illustrated at a subsequent step. Following the formation of adhesive layer 20, portions of the adhesive proximate conductive bumps 14 are preferably removed. As shown in FIG. 4, portions of adhesive layer 20 adjacent (e.g., below) conductive bumps 14 have been removed to expose conductive bumps 14. More specifically, portions of adhesive layer 20 aligned with conductive bumps 14 have been removed. The removal of selected portions of adhesive layer 20 outwardly exposes a plurality of conductive bumps 14. One method of removing portions of adhesive 20 comprises etching, and for example using photoresist. An etch back processing step can be utilized to remove portions of adhesive layer 20 beneath conductive bumps 14. Further by way of example only, mechanical or chemical-mechanical polishing can be used. Other processes for removing desired portions of the adhesive can also be utilized.

A substrate 30 is illustrated in FIG. 4 opposite outer surface 12 of flip chip 10. Exemplary configurations of substrate 30 include printed circuit boards (PCB), flexible circuit substrates or other substrates. Substrate 30 includes an outer surface 34 and plural bond pads 32 which extend outwardly from outer surface 34. In the depicted arrangement, flip chip 10 is aligned with substrate 30. In particular, conductive bumps 14 of flip chip 10 correspond to and are aligned with respective bond pads 32 of substrate 30.

Figure 5:
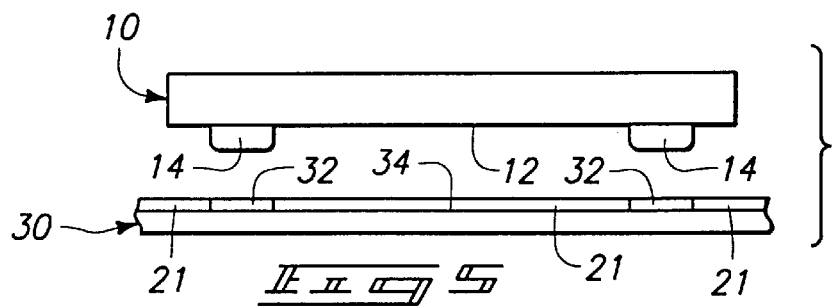
FIG. 5 is a side view of a flip chip aligned with another substrate having adhesive thereon.

Referring to FIG. 5, an alternative or additional step of FIG. 4 for coupling flip chip 10 and substrate 30 is illustrated. Similar to FIG. 4, a layer 21 of adhesive is provided on substrate 30 to facilitate coupling of flip chip 10 and substrate 30. In the configuration illustrated in FIG. 5, adhesive layer 21 is provided over at least a portion of surface 34 of substrate 30. Similar to the fabrication method described with reference to FIG. 4, an exemplary method of forming adhesive layer 21 comprises depositing a conformal layer of adhesive over substrate surface 34 and bond pads 32, and thereafter removing at least a portion of adhesive layer 21 to provide the depicted structure. The removal of portions of adhesive layer 21 adjacent or proximate bond pads 32 exposes bond pads 32. Preferably, portions of adhesive layer 21 aligned with bond pads 32 are removed. As illustrated, the thickness of adhesive layer 21 is approximately equal to the height of bond pads 32. Alternatively, layer 21 having a different thickness can be provided prior to coupling of flip chip 10 with substrate 30. An adhesive layer 20 is not provided on flip chip 10. It is also considered to provide adhesive layer 20 upon outer surface 12 of flip chip 10 as well as adhesive layer 21 upon outer surface 34 of substrate 30.

Figure 6:
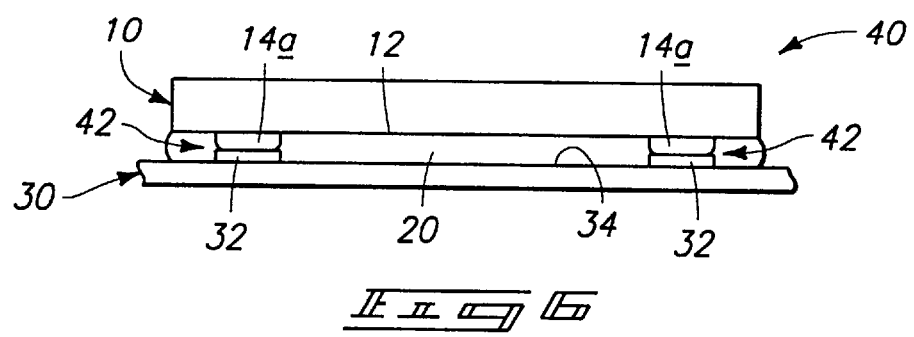
FIG. 6 is a side view of a flip chip coupled with a substrate forming plural electrical interconnections.

Referring to FIG. 6, a circuit 40 comprising flip chip 10 and substrate 30 is illustrated. Bond pads 32 of substrate 30 are electrically coupled with conductive bumps 14a of flip chip 10. Conductive bumps 14a illustrated in FIG. 6 have been reflowed and individually have a reduced height. Layer 20 of adhesive operates to facilitate bonding of outer surface 12 of flip chip 10 with outer surface 34 of substrate 30. Alternatively, adhesive layer 21 can be utilized alone or with layer 20 to bond outer surface 12 of flip chip 10 with outer surface 34 of substrate 30 to form circuit 40.

Electrical coupling of conductive bumps 14a with bond pads 32 forms plural electrical interconnections 42 intermediate flip chip 10 and substrate 30. Electrical interconnections 42 provide electrical coupling of circuitry internal to flip chip 10 and circuitry upon or within substrate 30.

As illustrated, flip chip 10 and substrate 30 are preferably coupled following the provision of one or both of adhesive layer 20 upon outer surface 12 of flip chip 10 and adhesive layer 21 upon outer surface 34 of substrate 30. Conductive bumps 14a of flip chip 10 may be welded to bond pads 32 of substrate 30 to form electrical interconnections 42. A conductive adhesive is utilized in some embodiments to electrically and mechanically couple conductive bumps 14a and bond pads 32.

In one exemplary embodiment wherein conductive bumps 14 comprise a reflowable material, such as solder, flip chip 10 can be attached to substrate 30 with a pressure heat application to reflow conductive bumps 14a and cure adhesive 20. Reflowing provides conductive bumps 14a of reduced height compared with conductive bumps 14. Such permits adhesive layer 20 and/or adhesive layer 21 to couple outer surface 12 of flip chip 10 with outer surface 34 of substrate 30. In an alternative embodiment, adhesive layers 20, 21 having increased thicknesses are utilized.

Figure 7:
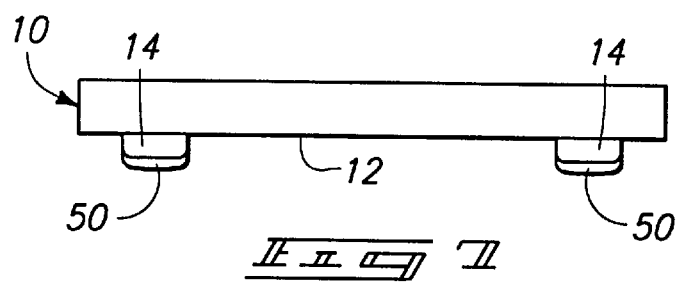
FIG. 7 is a side view of a flip chip having a masking layer provided over plural conductive bumps.
Figure 8:
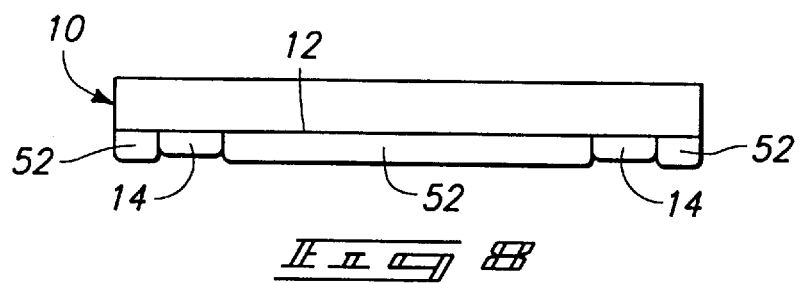
FIG. 8 is a side view of a flip chip having an adhesive provided over an outer surface.

Referring to FIG. 7 and FIG. 8, another method of forming an adhesive layer over outer surface 12 of flip chip 10 is illustrated. Referring specifically to FIG. 7, a mask 50 is initially provided over selected portions of outer surface 12 of flip chip 10. In particular, mask 50 is initially formed over conductive bumps 14. Mask 50 in but one example embodiment can comprise photoresist and is formed utilizing photolithographic processing techniques.

Referring to FIG. 8, an adhesive layer 52 is formed upon outer surface 12 of flip chip 10. Layer 52 of adhesive is provided over substantially the entire outer surface 12 of flip chip 10. Mask 50 of is FIG. 7 is subsequently removed from conductive bumps 14, leaving bumps 14 outwardly exposed. In this example embodiment, adhesive layer 52 is formed to a thickness approximately equal to or thicker than the height of conductive bumps 14. Thereafter, conductive bumps 14 of flip chip 10 are coupled with bond pads 32 of substrate 30 to form electrical interconnections.

Figure 9:
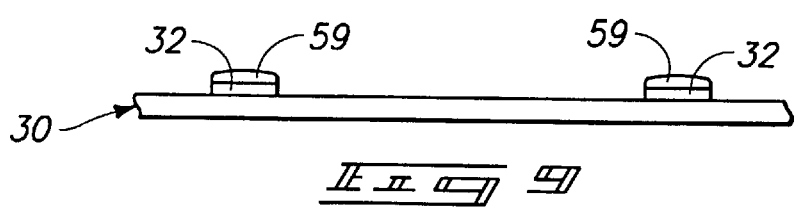
FIG. 9 is a side view of a substrate having a masking layer provided over plural bond pads.
Figure 10:
FIG. 10 is a side view of a substrate having an adhesive layer provided over an outer surface.

Referring to FIG. 9 and FIG. 10, a method of applying adhesive over surface 34 of substrate 30 for coupling flip chip 10 and substrate 30 is illustrated. Referring to FIG. 9, a mask 59 is illustrated over bond pads 32. An example material for mask 59 is photoresist. Referring to FIG. 10, an adhesive layer 54 is formed upon at least a portion of outer surface 34 of substrate 30. Layer 54 of adhesive is provided over substantially the entire outer surface 34 of substrate 30. Mask 59 is subsequently removed from bond pads 32. Adhesive layer 54 is preferably formed to a thickness approximately equal to or thicker than the height of bond pads 32. Such facilitates attachment of flip chip 10 with substrate 30 and coupling of outer surface 12 of flip chip 10 with outer surface 34 of substrate 30. Thereafter, conductive bumps 14 of flip chip 10 are coupled with bond pads 32 of substrate 30 (not shown).

Figure 11:
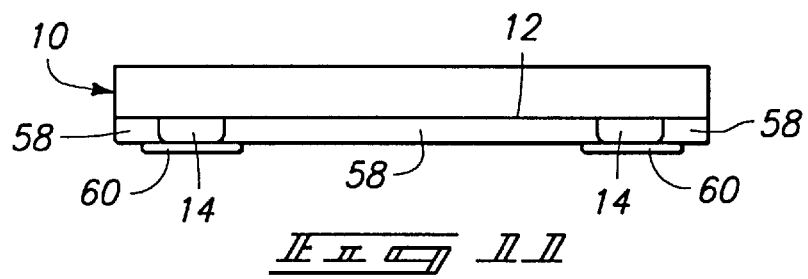
FIG. 11 is a side view of a flip chip having an adhesive layer and a mask.
Figure 12:
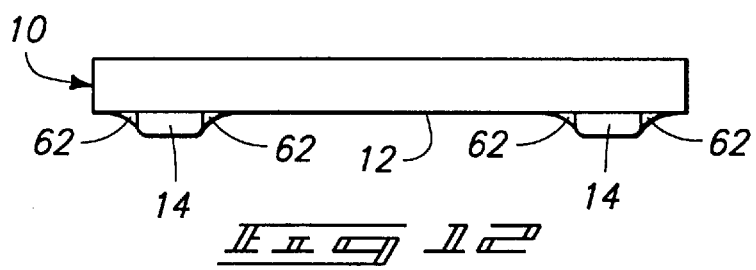
FIG. 12 is a side view of a flip chip having adhesive fillets provided about plural conductive bumps.

Referring to FIGS. 11 and 12, another implementation is described. Referring to FIG. 11, flip chip 10 has an adhesive layer 58 formed over outer surface 12. Adhesive layer 58 may be formed in a manner similar to that of adhesive layer 20 previously described with reference to FIG. 4. In particular, an adhesive layer is formed over substantially the entire outer surface 12 and conductive bumps 14 of flip chip 10. Thereafter, the adhesive formed upon flip chip 10 is etched back to form layer 58 of adhesive shown in FIG. 11. Subsequently, a mask 60 is formed adjacent conductive bumps 14. Mask 60 comprises respective circular portions individually having a radius slightly larger than a radius of individual conductive bumps 14. In an exemplary embodiment, mask 60 comprises photoresist formed by photolithographic processing techniques.

Referring to FIG. 12, a plurality of discrete adhesive fillets 62 have been formed at least partially about conductive bumps 14 from adhesive layer 58. According to one embodiment, flip chip 10 and masked adhesive layer 58 shown in FIG. 11 are subjected to a largely undercutting isotropic etch to create fillets 62. An organic solvent can be utilized as an exemplary etchant for thermoplastic co-polyimide adhesive. Following appropriate etching of adhesive layer 58, mask 60 is removed from conductive bumps 14 to provide the configuration shown in FIG. 12. Fillets 62 preferably individually have a height approximately equal to or less than the height of conductive bumps 14 shown in FIG. 12.

Conductive bumps 14 are reflowed to form electrical interconnections with bond pads 32. Reflowing provides conductive bumps 14a (shown in FIG. 14) individually having a reduced height compared with conductive bumps 14. As such, fillets 62 of adhesive preferably have a slightly greater height than individual reflowed conductive bumps 14a to provide coupling of flip chip 10 with substrate 30. Conductive bumps 14 remain outwardly exposed following the formation of adhesive fillets 62.

According to another embodiment, mask 60 is not utilized and adhesive layer 58 is subjected to anisotropic etching to form side wall fillets about conductive bumps 14. In such an embodiment, an etch back of adhesive below conductive bumps 14 is not performed before such isotropic etching.

Figure 13:
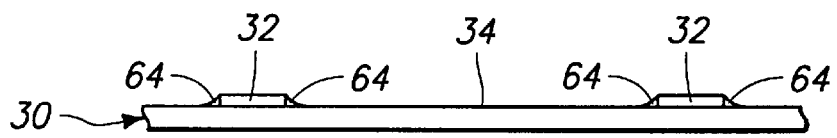
FIG. 13 is a side view of a substrate having adhesive fillets provided about plural bond pads.

Referring to FIG. 13, plural adhesive fillets 64 are illustrated about bond pads 32 of substrate 30. Fillets 64 are provided at least partially about respective bond pads 32. Adhesive fillets 64 can be formed utilizing similar processing techniques described above with reference to the formation of adhesive fillets 62 about conductive bumps 14. A preferred material is polyimide. Fillets 64 are preferably formed to a height approximately equal to or less than the height of bond pads 32 illustrated in FIG. 13.

Adhesive fillets 62 formed about conductive bumps 14 and adhesive fillets 64 formed about bond pads 32 can be utilized either individually or together to provide coupling of conductive bumps 14 with bond pads 32 and flip chip outer surface 12 with substrate outer surface 30.

Figure 14:
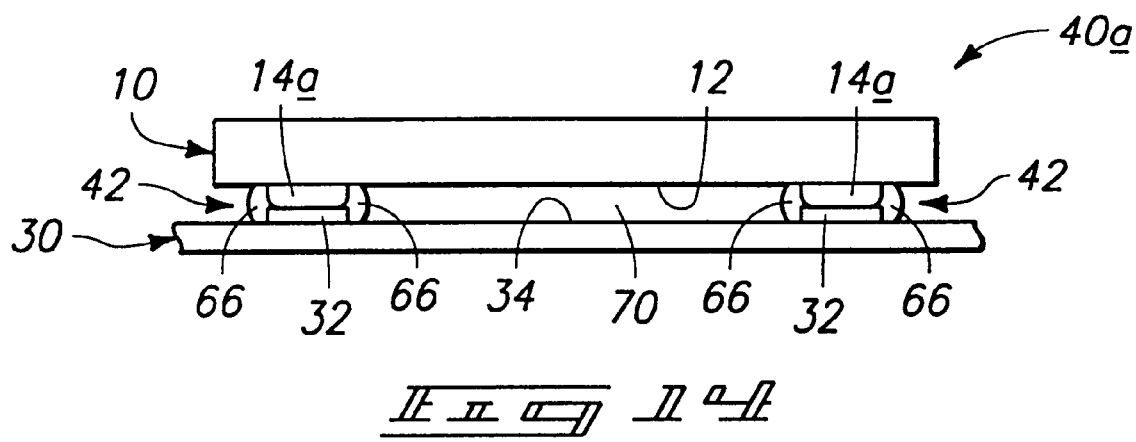
FIG. 14 is a side view of a flip chip coupled with a substrate and having plural adhesive fillets about plural electrical interconnections.

Referring to FIG. 14, flip chip 10 is shown coupled with substrate 30 to form a circuit 40a. Fillets 66 are provided about at least a portion of electrically coupled conductive bumps 14a and bond pads 32 which form electrical interconnections 42. Fillets 66 provide improved temperature cycling performance and are configured to support respective electrical interconnections 42 intermediate flip chip 10 and substrate 30. As shown, adhesive fillets 66 are formed from both of adhesive fillets 62 and adhesive fillets 64. Alternatively, fillets provided about electrical interconnections 42 are formed from adhesive fillets provided about one of bumps 14 or bond pads 32. Adhesive fillets 66 comprise discrete adhesive fillets which are provided about electrical interconnections 42 in the described embodiment. Reflowing provides conductive bumps 14a of reduced height permitting adhesive fillets 66 to couple outer surface 12 of flip chip 10 with outer surface 34 of substrate 30.

Outer surface 12 of flip chip 10 and outer surface 34 of substrate 30 define a buffer volume 70 therebetween. As shown in FIG. 14, buffer volume 70 has a greater volume of void space than adhesive comprising fillets 66.

Figure 15:
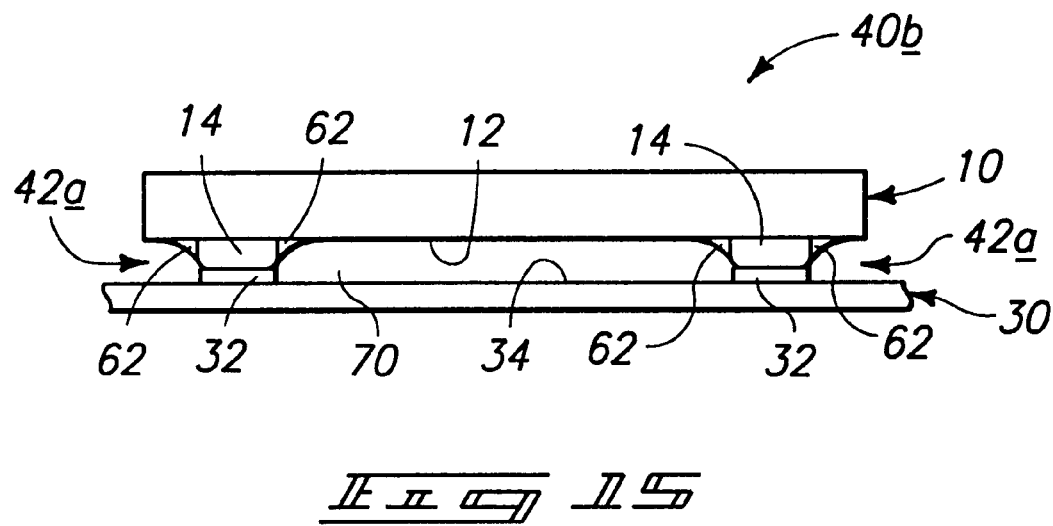
FIG. 15 is a side view of a flip chip coupled with a substrate and having plural adhesive fillets about plural conductive bumps.

Referring to FIG. 15, another circuit 40b is illustrated. The mere formation of adhesive fillets 62 about conductive bumps 14 increases the reliability and integrity of conductive bumps 14. Conductive bumps 14 having increased reliability and integrity as a result of adhesive fillets 62 may be provided even if no further reflow of conductive bumps 14 is conducted. As such, flip chip 10 having conductive bumps 14 and adhesive fillets 62 can be coupled with substrate 30 to form circuit 40b shown in FIG. 15. Conductive bumps 14 form electrical interconnections 42a with bond pads 32.

Coupling flip chip 10 with substrate 30 in accordance with preferred implementations of the present invention permits such attachment utilizing equipment in-line with current wafer fabrication equipment (e.g., spin-on die coaters, etchers, etc.). Such also permits fast coupling of flip chip 10 with substrate 30. Further, the number of voids occurring within the adhesive intermediate flip chip 10 and substrate 30 can be significantly reduced. Accordingly, the number of defects occurring during attachment of flip chip 10 with substrate 30 can be reduced.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A circuit comprising:
   an integrated circuit device having an outer surface and a plurality of conductive bumps upon the outer surface;
   a substrate having an outer surface having a plurality of bond pads electrically coupled with the conductive bumps of the integrated circuit device in opposing relation, the outer surface of the integrated circuit device and the outer surface of the substrate defining a buffer volume therebetween; and
   an adhesive bonding the outer surface of the integrated circuit device and the outer surface of the substrate together, the buffer volume having a greater volume of void space than adhesive.

2. The circuit according to claim 1 wherein the adhesive comprises a plurality of discrete adhesive fillets provided about the electrically coupled conductive bumps and bond pads.

3. The circuit according to claim 1 wherein the adhesive is electrically insulative.

4. The circuit according to claim 1 wherein the integrated circuit device comprises a flip chip.

5. The circuit according to claim 1 wherein the adhesive contacts the conductive bumps and bond pads.

6. A circuit comprising:
   an integrated circuit device having an outer surface and a plurality of conductive bumps upon the outer surface;
   a substrate having an outer surface having a plurality of bond pads electrically coupled with the conductive bumps of the integrated circuit device in opposing relation; and
   a plurality of discrete adhesive fillets provided about an entirety of the outwardly exposed surfaces of the coupled conductive bumps of the integrated circuit device and the corresponding bond pads of the substrate;
   wherein the adhesive fillets are configured to bond the outer surface of the integrated circuit device and the outer surface of the substrate.

7. The circuit according to claim 6 wherein the adhesive fillets are electrically insulative.

8. The circuit according to claim 6 wherein the integrated circuit device comprises a flip chip.

9. The circuit according to claim 6 wherein the adhesive fillets contact the coupled conductive bumps and bond pads.

10. The circuit according to claim 6 wherein the outer surface of the integrated circuit device and the outer surface of the substrate define a buffer volume therebetween having a greater volume of void space than a volume of the adhesive fillets.

11. A circuit comprising:
    an integrated circuit device having an outer surface and a plurality of conductive bumps upon the outer surface;
    a substrate having an outer surface having a plurality of bond pads electrically coupled with the conductive bumps of the integrated circuit device in opposing relation; and
    a plurality of discrete adhesive fillets provided about an entirety of the outwardly exposed surfaces of the coupled conductive bumps of the integrated circuit device and the corresponding bond pads of the substrate;
    wherein the adhesive fillets are electrically insulative.

* * * * *

UNITED STATES PATENT AND TRADEMARK OFFICE
CERTIFICATE OF CORRECTION

PATENT NO. : 6,528,890 B1
DATED : March 4, 2003
INVENTOR(S) : Joseph M. Brand

It is certified that error appears in the above-identified patent and that said Letters Patent is hereby corrected as shown below:

Column 5,
Line 36, please delete "is" after "of".

Signed and Sealed this

First Day of July, 2003

JAMES E. ROGAN
*Director of the United States Patent and Trademark Office*